United States Patent
Dale et al.

(10) Patent No.: US 7,443,924 B2
(45) Date of Patent: Oct. 28, 2008

(54) RESIDUAL CARRIER AND SIDE BAND PROCESSING SYSTEM AND METHOD

(75) Inventors: Mark Dale, Hudson, OH (US); William H. Thesling, Hudson, OH (US)

(73) Assignee: ViaSat, Inc., Carlsbad, CA (US)

( * ) Notice: Subject to any disclaimer, the term of this patent is extended or adjusted under 35 U.S.C. 154(b) by 735 days.

(21) Appl. No.: 10/955,223

(22) Filed: Sep. 30, 2004

(65) Prior Publication Data

US 2005/0101269 A1    May 12, 2005

Related U.S. Application Data (60) Provisional application No. 60/507,254, filed on Sep. 30, 2003.

(51) Int. Cl.
*H04L 27/36*    (2006.01)

(52) U.S. Cl. .................. 375/298; 375/299; 375/300; 375/317

(58) Field of Classification Search .......... 375/298, 375/308, 224, 279, 280, 283, 299, 261, 300; 455/126, 108, 114.2
See application file for complete search history.

(56) References Cited

U.S. PATENT DOCUMENTS

| | | | |
|---|---|---|---|
| 5,293,406 A * | 3/1994 | Suzuki | 375/295 |
| 5,796,783 A * | 8/1998 | Crawford | 375/298 |
| 5,862,466 A | 1/1999 | Erickson | |
| 6,169,463 B1 * | 1/2001 | Mohindra et al. | 332/104 |
| 6,356,594 B1 * | 3/2002 | Clement et al. | 375/261 |
| 6,535,562 B1 * | 3/2003 | Mohseni et al. | 375/296 |
| 6,745,015 B2 * | 6/2004 | Yochem | 455/126 |
| 6,766,157 B1 | 7/2004 | Hunzeker et al. | |
| 6,853,690 B1 * | 2/2005 | Sorrells et al. | 375/295 |
| 7,068,730 B2 * | 6/2006 | Monta | 375/298 |
| 2003/0013426 A1 | 1/2003 | Kim et al. | |
| 2004/0032913 A1 * | 2/2004 | Dinur | 375/298 |
| 2005/0059361 A1 * | 3/2005 | Shi et al. | 455/115.1 |
| 2005/0169402 A1 * | 8/2005 | Niwa et al. | 375/298 |

OTHER PUBLICATIONS

Analog Devices, 0.8 GHz-2.5 GHz Quadrature Modulator, Analog Devices, Inc., 1999 (12 pages).

* cited by examiner

*Primary Examiner*—Chieh M. Fan
*Assistant Examiner*—Qutbuddin Ghulamali
(74) *Attorney, Agent, or Firm*—Townsend and Townsend and Crew LLP (57) ABSTRACT

In a communication device, the LO leakage and opposite side band signals are measured at an output signal. Input processing signals to a modulator are adjusted in response to the measured values to minimize the LO leakage and maximize side band suppression.

18 Claims, 5 Drawing Sheets

RESIDUAL CARRIER AND SIDE BAND PROCESSING SYSTEM AND METHOD

This application claims the benefit of U.S. Provisional Application Ser. No. 60/507,254, filed on Sep. 30, 2003, and entitled "Residual Carrier And Side Band Detection And Removal," the entire disclosure of which is incorporated herein by reference.

BACKGROUND AND SUMMARY

This disclosure generally relates to communication systems and methods, and particularly relates to leakage and side band signal suppression.

Most low cost two-way wireless communication systems generate baseband signals in a baseband frequency range. These signals are typically converted to an intermediate frequency or radio frequency (IF/RF) by a modulator device. An example modulator may be the AD8346 Quadrature Modulator from Analog Devices, Inc., which is a single-step analog up-converter that generates an L-Band (IF) signal from complex (in-phase and quadrature) baseband analog signals.

Such modulator devices are preferred due to their simplicity and low cost; however, these devices often have an L-band synthesizer (sine wave) signal and/or an opposite side band signal at the output, which can have deleterious effects on system performance. The L-band synthesizer signal is often referred to as "carrier bleed through" or "local oscillator (LO) leakage," and the opposite side band signal is often referred to as the "negative image signal." The LO leakage, although small compared to the desired output signal, can be a significant portion of the total output power. Additionally, the L-band synthesizer signal typically does not change in response to changes in the in-phase and quadrature baseband signal amplitude. The opposite side band signal is likewise small compared to the desired output signal, but may cause interference to a user operating in the frequency range of the opposite side band signal.

The LO leakage and opposite side band signals can be minimized by proper adjustment of the in-phase and quadrature input signals. Disclosed herein is an apparatus and method to measure the LO leakage and opposite side band signals. Also disclosed herein is an apparatus and method to adjust the input processing signals to a quadrature modulator to minimize the LO leakage and side band signals.

DETAILED DESCRIPTION

Figure 1:
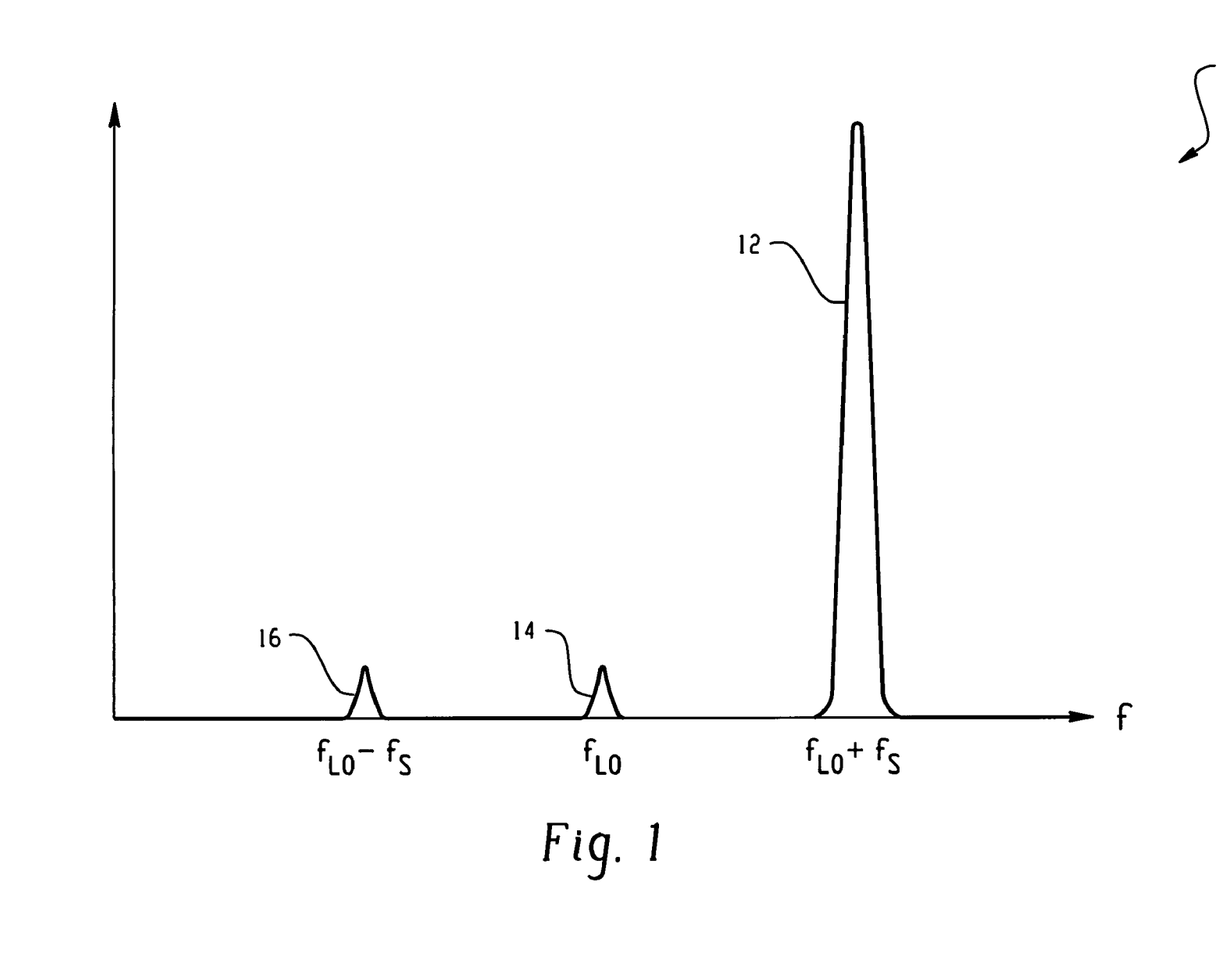
FIG. 1 is a graph of the frequency spectrum of an output signal from a modulator.

FIG. 1 is a graph 10 of the frequency spectrum of an output signal from a modulator. The modulator may comprise, for example, a quadrature amplitude modulator or an analog-up converter. The spectrum of FIG. 1 is generated by modulating a signal generated by a local oscillator having a frequency of $f_{LO}$ by in-phase and quadrature baseband signals having a frequency of $f_S$. An ideal modulator having no LO leakage and infinite side band suppression would generate an output carrier signal having a spectral distribution only about the frequency $f_{LO}+f_S$. Practical systems, however, typically have an LO leakage component at $f_{LO}$ and an opposite side band signal at $f_{LO}-f_S$. The magnitude of the side band signal is usually dependent on the magnitude of the baseband signals, while the magnitude of the LO leakage signal is usually independent of the magnitude of the baseband signals.

Figure 2:
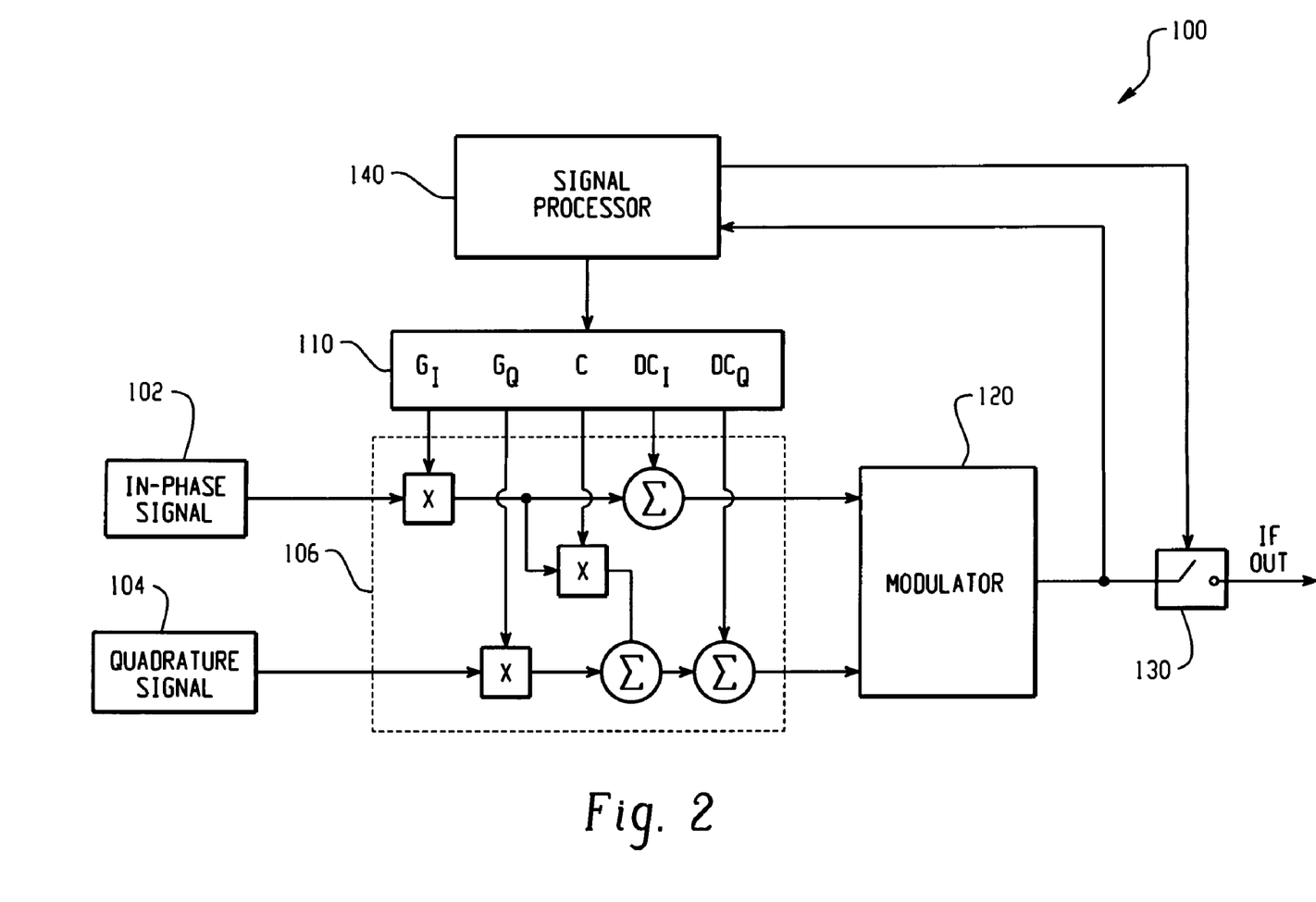
FIG. 2 is a block diagram of a system for detecting and minimizing LO leakage and opposite side band signals.

FIG. 2 is a block diagram of a system 100 for detecting and minimizing LO leakage and opposite side band signals. The example system 100 of FIG. 2 has a programming mode and an operational mode. In the programming mode, the system 100 generates test signals and measures the LO leakage and opposite side band signal present at an output signal of the modulator 120. Input processing signals are adjusted in response to the measured values to minimize the LO leakage and side band signals. In one embodiment, baseband processing of the LO leakage and side band signals is utilized to minimize performance requirements. Upon reducing the LO leakage and side band signals to acceptable levels, the system 100 enters an operational mode. During the operational mode, the normal processing of data may be performed.

An in-phase signal channel 102 and a quadrature signal channel 104 are used for processing in-phase data signals and quadrature data signals, respectively. A baseband signal controller 110 generates control signals to adjust processing of the in-phase and quadrature data signals over the in-phase signal channel 102 and a quadrature signal channel 104, respectively. The baseband signal controller 110 may comprise digital signal processing circuitry and/or software operable to realize the functionality described herein. Examples of such circuitry and/or software include a field programmable gate array (FPGA), an application specific integrated circuit (ASIC), or a computer processor operable to execute processor-executable instructions.

A signal processor 140 is configured to receive the modulated carrier signal output from a modulator 120 and to detect at least one of an LO leakage signal and a side band signal in the modulated carrier signal and generate control signals to control the baseband signal controller 110. In one embodiment, the signal processor 140 detects and measures the LO leakage and side band signal at a baseband frequency. At least one of a gain control signal and a DC offset control signal are generated as control signals. The gain control signal and the DC offset control signal are provided to the baseband signal controller 110 which, in turn, adaptively generates an in-phase channel gain $G_I$, a quadrature channel gain $G_Q$, and a channel correlation C, an in-phase channel DC offset $DC_I$, and a quadrature channel DC offset $DC_Q$ control signal. These control signals are utilized to adjust processing over the in-phase signal channel 102 and a quadrature signal channel 104 so as to minimize the LO leakage and side band signals.

Figure 3:
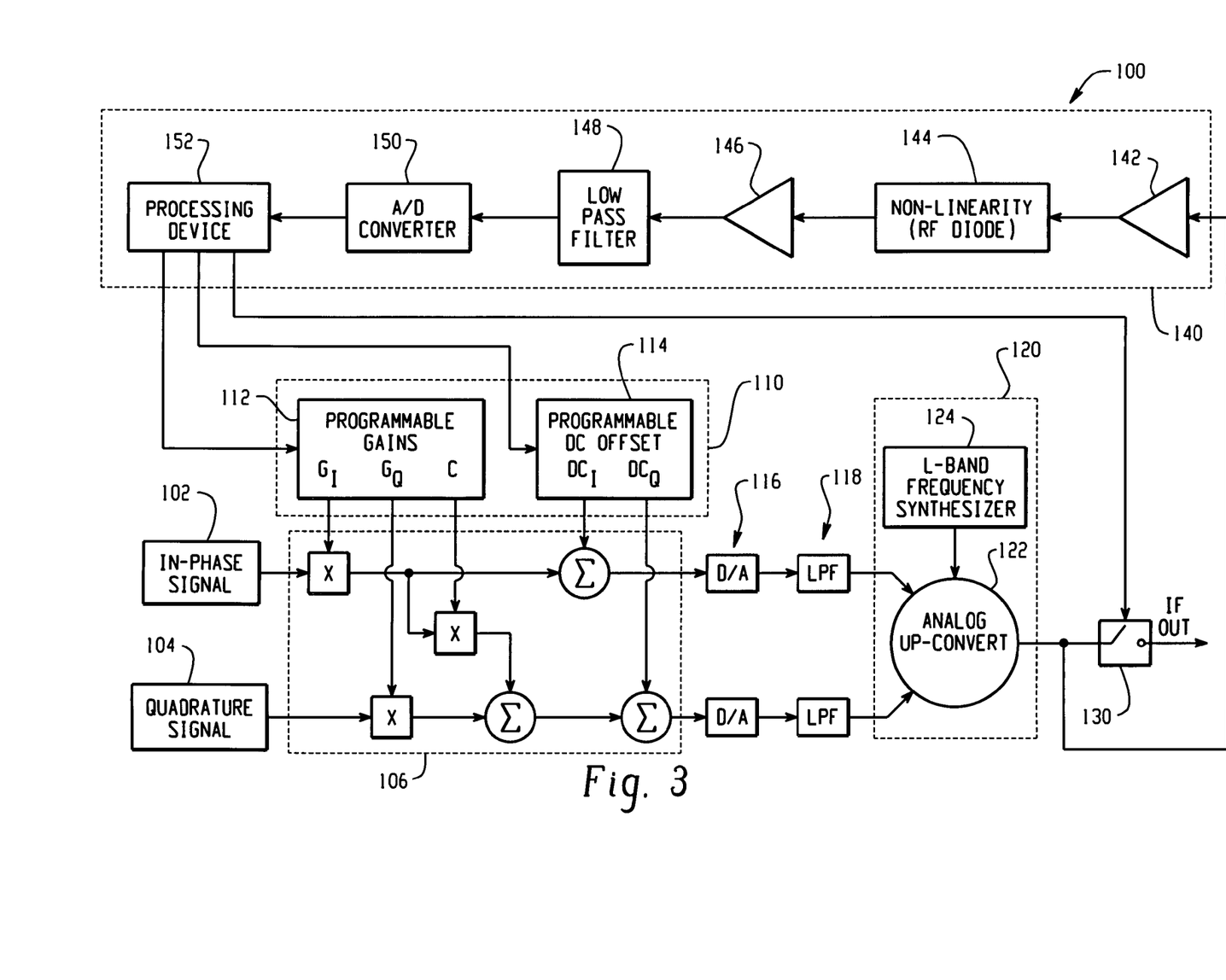
FIG. 3 is an example embodiment of the system of FIG. 2.

FIG. 3 is an example embodiment of the system of FIG. 2. In this example embodiment, the baseband signal controller 110 comprises a programmable gain controller 112 and a programmable DC offset controller 114. The gain controller 112 generates the in-phase channel gain $G_I$, the quadrature channel gain $G_Q$, and the channel correlation C. The DC offset controller 114 generates the in-phase channel DC offset $DC_I$ and the quadrature channel DC offset $DC_Q$. The signals $G_I$, $G_Q$, C, $DC_I$ and $DC_Q$ are utilized to drive channel processing circuitry 106. In the example embodiment of FIG. 3 the channel processing circuitry 106 comprises summing circuitry and gain circuitry.

Digital-to-analog converters 116 and low pass filters 118 convert the in-phase and quadrature data into respective analog waveforms. A modulator 120 modulates a local oscillator signal by the analog waveforms to generate a modulated carrier signal. In one embodiment, the modulator 120 comprises an analog up-converter 122 and an L-band frequency synthesizer 124. An isolation device 130 is configured to preclude transmission of the modulated carrier signal during the programming mode and allow for transmission of the modulated carrier signal during the operational mode.

In the example embodiment of FIG. 3, the signal processor 140 comprises a buffer amplifier 142, an non-linear operational circuit 144, an amplifier 146, a low pass filter 148, an analog-to-digital converter 150, and a processing device 152. The non-linear operational circuit 144 has a non-linear response that generates signals at the sums and differences of the frequencies of the input. In one embodiment, the non-linear operational circuit 144 comprises an RF diode. Accordingly, passing the modulated carrier signal having the spectrum of FIG. 1 through the RF diode 144 will generate a plurality of signals at frequencies that are the sums and differences of $f_{LO}-f_S$, $f_{LO}$, and $f_{LO}+f_S$, i.e., $f_S$, $2f_S$, etc. The resulting signals at the frequencies $f_S$ and $2f_S$ have amplitudes corresponding to the magnitudes of the LO leakage and side band signals, respectively.

The amplifier 146 amplifies the output of the RF diode 144 and provides the amplified signal to the low pass filter 148. The analog-to-digital converter 150 converts the analog output waveform from the low pass filter 148 into a digital value and provides the digital value to the processing device 152. The processing device 152, in turn, determines the magnitude of signal components corresponding to the LO leakage and side band signals, and adaptively generates control signals to drive the baseband controller 110.

By detecting and measuring signals representative of the LO leakage and the side band signals at baseband instead of detecting and measuring the actual signals at the carrier frequency, the processing resources and performance requirements are minimized. The processing device 152 may comprise digital signal processing circuitry and/or software operable to realize the described functionality. Examples of such circuitry and/or software include a FPGA, an ASIC, or a computer processor operable to execute processor-executable instructions.

Figure 4:
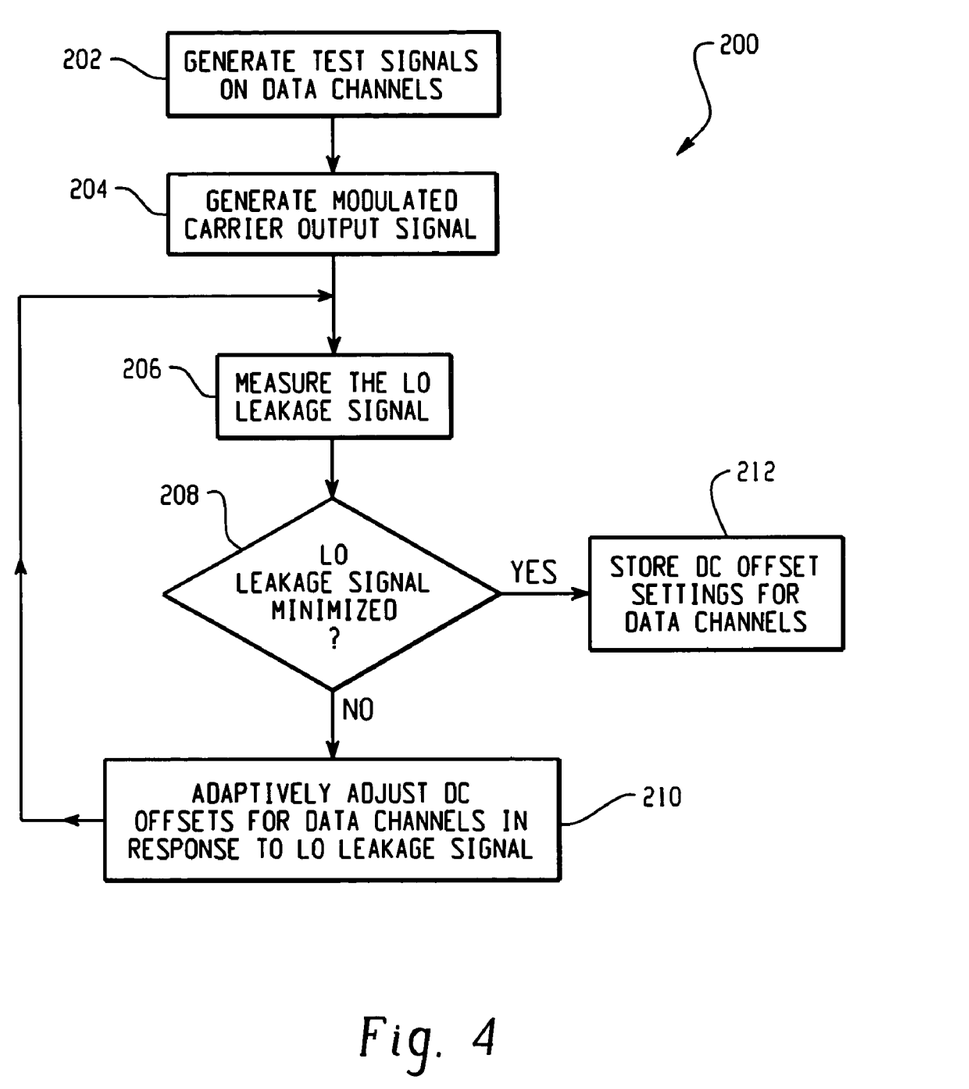
FIG. 4 is a flow diagram of a process of detecting and minimizing an LO leakage signal.
Figure 5:
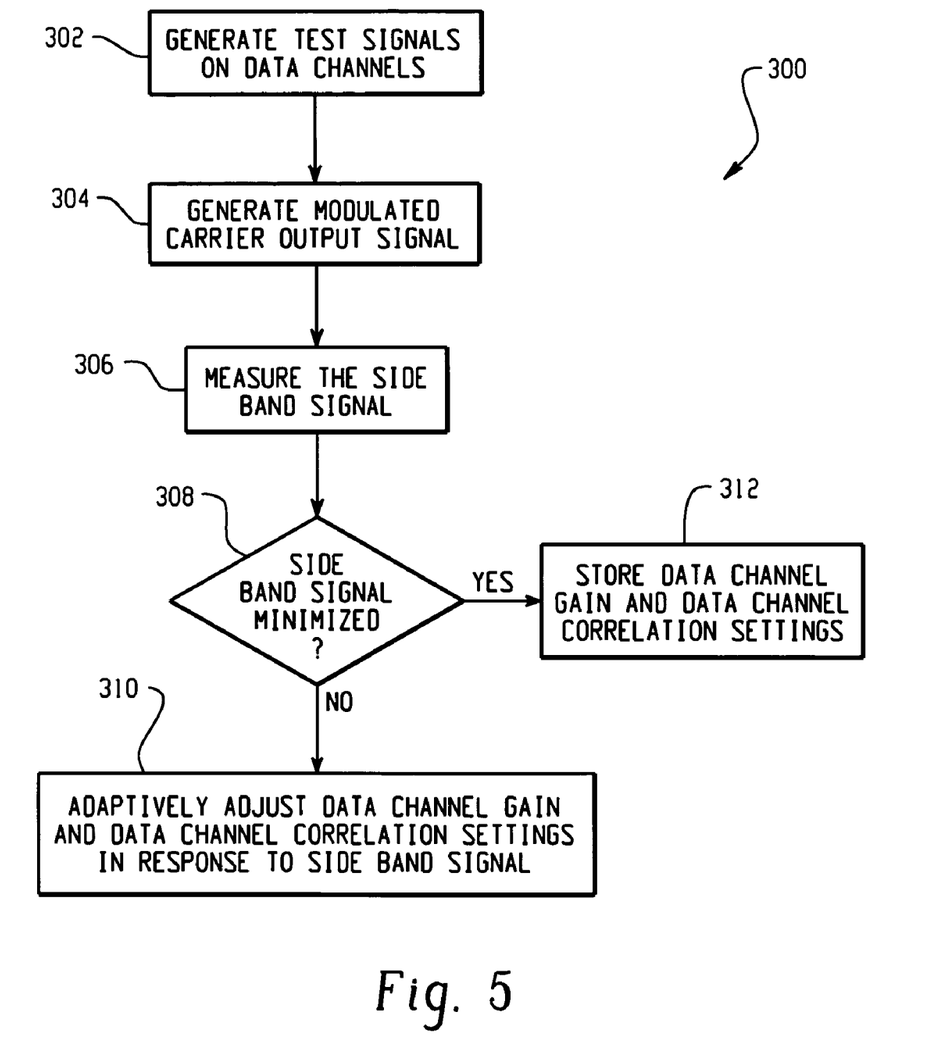
FIG. 5 is a flow diagram of a process of detecting and minimizing an opposite side band signal.

Operation of the system 100 of FIGS. 2 and 3 will now be described with reference to FIGS. 4 and 5. FIG. 4 is a flow diagram 200 of a process of detecting and minimizing an LO leakage signal, and FIG. 5 is a flow diagram 300 of a process of detecting and minimizing a side band signal.

To minimize LO leakage, the system 100 operates in the programming mode and adaptively adjusts the in-phase channel DC offset and the quadrature channel DC offset until the LO leakage is below an acceptable threshold value. To insure that the output signal of the modulator 120 is not transmitted during the programming mode, the processing device 152 disables the output via the isolation device 130.

The process 200 of FIG. 4 begins at step 202, which generates a test signal on the in-phase and quadrature data channels 102 and 104. The test signal may comprise a single tonal at a relatively low frequency $f_S$ compared to the carrier frequency $f_{LO}$. In the example system of FIG. 3, the L-band frequency synthesizer generates a carrier signal at a carrier frequency $f_{LO}$ of 1 GHz, and the test signal comprises a tonal at a frequency $f_S$ of 1 KHz and at an amplitude high enough to drive the non-linearity. For example, if the non-linearity is realized by a diode, the amplitude of the signal is of such magnitude that the diode is forward biased beyond the turn-on voltage for positive magnitudes.

Step 204 generates a modulated carrier output signal. The output of the modulator 120 comprises an LO leakage sine wave at $f_{LO}$, a programmed sine wave at $f_{LO}+f_S$, and a negative side band sine wave at $f_{LO}-f_S$. The LO leakage sine wave and the negative side band sine wave are usually smaller in magnitude than the programmed sine wave at $f_{LO}+f_S$.

Step 206 measures the LO leakage signal. In the example system 100 of FIG. 2, the LO leakage signal is measured by measuring a baseband signal representative of the actual LO leakage signal. The LO leakage measurement is obtained by the signal processor 140. A plurality of signals at the sums and differences of frequency components $f_{LO}-f_S$, $f_{LO}$, and $f_{LO}+f_S$ in the modulated carrier signal are generated. In one embodiment, the plurality of signals are generated by passing the modulated carrier signal through a non-linearity 144 realized by a RF diode.

The output of the RF diode 144 comprises a sine wave at a frequency of $f_S$ having an amplitude proportional to the LO leakage at the frequency $f_{LO}$ in the modulated carrier signal. An amplifier 146 may be utilized to amplify the output of the RF diode 144 to facilitate signal processing. Additional higher frequency components are also present at the output of the diode 144, and thus the signal is low pass filtered by a filter 148. In one embodiment, the low pass filter 148 has a cut off frequency of $3f_S$.

The analog-to-digital converter 150 converts the signal from the low pass filter 148 to a corresponding digital value for processing by the processing device 152. In one embodiment, the analog-to-digital converter 150 has an 8-bit resolution. This resolution and the gain of the amplifier 146 determine the minimum signal strength that can be measured. In the example embodiment of FIG. 2, the analog-to-digital converter 150 sample rate is greater than $4 f_S$.

The processing device 152 receives the output of the analog-to-digital converter and generates an LO leakage signal value proportional to the LO leakage at $f_{LO}$ in the modulated carrier signal. The processing device 152 may be configured to carry out spectral analysis functions to determine magnitude of the frequency component at $f_S$.

Step 208 determines if the LO leakage signal is minimized. In one embodiment, the processing device 152 determines that the LO leakage signal is minimized if the LO leakage signal is below a leakage threshold. In another embodiment, the processing device 152 determines that the LO leakage signal is minimized if further changes to the in-phase and quadrature DC offset values do not further reduce the LO leakage signal value.

If the LO leakage signal is not minimized, then step 210 adaptively adjusts the DC offsets of the data channels in response to the LO leakage signal. In the system of FIG. 3, the processing device 152 generates a DC offset control signal to drive the DC offset controller 114 in the baseband signal controller 110. Adjusting the DC offsets on the in-phase and quadrature signal channels 102 and 104 will affect the magnitude of the LO leakage signal. Accordingly, the processing device 152 is configured to continuously adjust the DC offset control signal until the magnitude of the LO leakage signal is minimized.

In the example system of FIGS. 2 and 3, the processing device 152 generates a DC offset control signal that causes the DC offset controller 114 to iteratively adjust the in-phase DC offset and the quadrature DC offset to minimize the signal at $f_S$. After each adjustment, step 210 returns to step 206 and steps 206 and 208 are repeated. Upon step 208 determining that the LO leakage signal is minimized, step 212 stores the DC offset settings for each data channel. The system may then enter the operational mode for processing actual data.

The process of minimizing the side band signal is similar to the process of minimizing the LO leakage signal. To minimize the side band signal, the system 100 operates in the programming mode and adaptively adjusts the in-phase channel gain, the quadrature channel gain, and the channel correlation until the side band signal is below an acceptable threshold value. To insure that the output signal of the modulator 120 is not transmitted during the programming mode, the processing device 152 disables the output via the isolation device 130.

In an ideal system, the in-phase and quadrature gains are equal, and the phase difference between the in-phase and quadrature channels is 90°. However, in a practical system there exists an imbalance of the in-phase and quadrature channel gains and an imbalance of the in-phase and quadrature phase. The side band signal strength is controlled by a ratio of the in-phase and quadrature gain values and by the channel correlation. Thus, in one embodiment, one of the channel gains is set to a reference value and only the remaining channel gain and the channel correlation settings are adjusted. Thus, the channel gain imbalance can be minimized by setting the in-phase gain to a known value and varying the quadrature channel gain. Likewise, the phase imbalance may be adjusted by adjusting the correlation gain setting, which under ideal conditions is zero.

The process 300 of FIG. 5 begins at step 302, which generates a test signal on the in-phase and quadrature data channels 102 and 104. The test signal may comprise a single tonal at a relatively low frequency $f_S$ compared to the carrier frequency $f_{LO}$. In the example system of FIG. 3, the L-band frequency synthesizer generates the carrier signal at a carrier frequency $f_{LO}$ of 1 GHz, and the test signal comprises a tonal at a frequency $f_S$ of 1 KHz and at an amplitude high enough to drive the non-linearity.

Step 304 generates a modulated carrier output signal. The output of the modulator 120 comprises an LO leakage sine wave at $f_{LO}$, a programmed sine wave at $f_{LO}+f_S$, and a negative side band sine wave at $f_{LO}-f_S$. The LO leakage sine wave and the negative side band sine wave are usually smaller in magnitude than the programmed sine wave at $f_{LO}+f_S$.

Step 306 measures the side band signal. In the example system 100 of FIG. 2, the side band signal is measured by measuring a baseband signal representative of the actual side band signal. The side band signal measurement is obtained by the signal processor 140. A plurality of signals at the sums and differences of frequency components $f_{LO}-f_S$, $f_{LO}$, and $f_{LO}+f_S$ in the modulated carrier signal are generated. In one embodiment, the plurality of signals are generated by passing the modulated carrier signal through a non-linearity 144 realized by an RF diode.

The output of the RF diode 144 comprises a sine wave at a frequency of $2f_S$ having an amplitude proportional to the side band signal at the frequency $f_{LO}-f_S$ in the modulated carrier signal. Additional higher frequency components are also present, and thus the output of the non-linearity 144 is low pass filtered. In one embodiment, the low pass filter has a cut off frequency of $3f_S$.

The analog-to-digital converter 150 converts the signal to a corresponding digital value for processing by the processing device 152. In one embodiment, the analog-to-digital converter 150 has an 8-bit resolution. This resolution and the gain of the amplifier 146 ultimately determines the minimum signal strength that can be measured. In the example embodiment of FIG. 2, the analog-to-digital converter 150 sample rate is greater than $4 f_S$.

The processing device 152 receives the output of the analog-to-digital converter and generates a side band signal value proportional to the side band signal at $f_{LO}-f_S$ in the modulated carrier signal. The processing device 152 may be configured to carry out spectral analysis functions to determine magnitude of the frequency component at $2f_S$.

Step 308 determines if the side band signal is minimized. In one embodiment, the processing device 152 determines that the side band signal is minimized if the side band signal is below a side band threshold. In another embodiment, the processing device 152 determines that the side band signal is minimized if further changes to the channel gain settings and the correlation setting values do not further reduce the side band signal value.

If the side band signal is not minimized, then step 310 adaptively adjusts the gains of the data channels and the correlation between the data channels in response to the side band signal. In the system of FIG. 3, the processing device generates a gain control signal to drive the gain controller 112 in the baseband signal controller 110. Adjusting the gain ratio of the in-phase and quadrature signal channels 102 and 104 and the correlation between the channels will affect the magnitude of the side band signal. Accordingly, the processing device 152 is configured to continuously adjust the gain control signal until the magnitude of the side band signal is minimized.

In the example system of FIGS. 2 and 3, the processing device 152 generates a gain control signal that causes the gain controller 112 to iteratively adjust the quadrature channel gain relative to a set in-phase channel gain and the correlation between the channels to minimize the signal at $2f_S$. After each adjustment, step 310 returns to step 306 and steps 306 and 308 are repeated. Upon step 308 determining that the side band signal is minimized, step 312 stores the data channel gain and correlation settings. The system may then enter the operational mode for processing actual data.

In the example embodiment of FIGS. 2 and 3, the correlation comprises an addition of a scaled multiple of the in-phase channel to the quadrature channel. Other operations may also be used, however, such as adjusting a phase shift between the in-phase channel and the quadrature channel.

The steps and the order of the steps in the methods and flowcharts described herein may be altered, modified and/or augmented and still achieve the desired outcome. Additionally, the methods, flow diagrams and structure block diagrams described in this patent document may be implemented in processing devices executing program code comprising program instructions. Other implementations may also be used, such as firmware or even appropriately designed hardware configured to carry out the methods and flow diagrams or implement the structure block diagrams described in this patent document. Example implementations include FPGAs, ASICs, or any other manufacture operable or configurable to realize the systems and methods described herein.

Additionally, the methods, flow diagrams and structure block diagrams described in this patent document that describe particular methods and/or corresponding acts in support of steps and corresponding functions in support of disclosed software structures may also be implemented in software stored in a computer readable medium, and equivalents thereof. The software structures may comprise source code, object code, machine code, or any other stored data that is operable to cause a processing system or configurable hardware device to perform methods described herein.

While the example embodiments described herein utilize baseband processing for detection and measurement of the LO leakage and side band signals, other processing techniques may also be used. For example, the LO leakage and side band signal may be directly measured at the modulated carrier signal by increasing the sampling rate of the A/D converter and by increasing the processing resources of the signal processor 140.

The above-described embodiments of the invention are intended to be examples only. Those of skill in the art may effect alterations, modifications and variations to the particular embodiments without departing from the scope of the invention.

What is claimed is:

1. A communication device-implemented method of processing communication signals, comprising:
   generating an in-phase baseband signal at a test frequency;
   generating a quadrature baseband signal at the test frequency;
   modulating a carrier signal by the in-phase and quadrature baseband signals to generate a modulated carrier signal;
   measuring a LO leakage signal in the modulated carrier signal, the measuring step comprising:
      generating sums and differences of frequency components in the modulated carrier signal;
      low pass filtering the generated sums and differences; and
      utilizing the filtered sums and differences to generate a digital value proportional to the magnitude of a spectral component at the test frequency, the digital value comprising a LO leakage signal value;
   adjusting at least one of an in-phase DC offset or a quadrature DC offset in response to the LO leakage signal value;
   determining if the magnitude of the LO leakage signal value as adjusted is below a leakage threshold; and
   if the magnitude of the LO leakage signal value as adjusted is not below the leakage threshold, continuing to adaptively adjust at least one of the in-phase DC offset or the quadrature DC offset in response to the LO leakage signal value until the LO leakage value is below the leakage threshold.

2. The method of claim 1, wherein modulating a carrier signal by the in-phase and quadrature baseband signals to generate a modulated carrier signal comprises:
   converting the in-phase and quadrature baseband signals into first and second analog signals; and
   up-converting the first and second analog signals by a carrier frequency.

3. The method of claim 1, further comprising:
   measuring a side band signal in the modulated carrier signal to obtain a side band signal value by generating sums and differences of frequency components in the modulated carrier signal.

4. The method of claim 3, wherein measuring a side band signal in the modulated carrier signal to obtain a side band signal value further comprises low pass filtering the generated sums and differences of signal frequencies.

5. The method of claim 3, wherein measuring a side band signal in the modulated carrier signal to obtain a side band signal value further comprises generating a digital value proportional to the magnitude of a spectral component at a multiple of the test frequency to generate the side band signal value.

6. The method of claim 3, further comprising:
   determining if the magnitude of the side band signal value is below a side band threshold; and
   if the magnitude of the side band signal value is not below the side band threshold, continuing to adaptively adjust at least one of an in-phase gain, a quadrature gain, or a channel correlation in response to the side band signal value until the side band signal value is below the side band threshold.

7. The method of claim 1, wherein measuring a LO leakage signal in the modulated carrier signal to obtain a LO leakage signal value comprises passing the modulated carrier signal through a radio frequency diode.

8. The method of claim 1, wherein measuring a LO leakage signal in the modulated carrier signal to obtain a LO leakage signal value comprises measuring the LO leakage signal and the side band signal at baseband.

9. A communication device-implemented method of processing communication signals, comprising:
   generating a in-phase baseband signal at a test frequency;
   generating a quadrature baseband signal at the test frequency;
   modulating a carrier signal by the in-phase and quadrature baseband signals to generate a modulated carrier signal;
   measuring a side band signal in the modulated carrier signal, the measuring step comprising:
      generating sums and differences of frequency components in the modulated carrier signal;
      low pass filtering the generated sums and differences; and
      utilizing the filtered sums and differences to generate a digital value proportional to the magnitude of a spectral component at the multiple of the test frequency, the digital value comprising a side band signal value;
   adjusting at least one of an in-phase gain, a quadrature gain, or a channel correlation in response to the side band signal value;
   determining if the magnitude of the side band signal value as adjusted is below a side band threshold; and
   if the magnitude of the side band signal value as adjusted is not below the side band threshold, continuing to adaptively adjust at least one of the in-phase gain, the quadrature gain, or the channel correlation in response to the side band signal value until the side band signal value is below the side band threshold.

10. The method of claim 9, further comprising:
    measuring a LO leakage signal or in the modulated carrier signal to obtain a LO leakage signal value, wherein the measuring a LO leakage signal comprises generating sums and differences of signal frequencies of the modulated carrier signal.

11. The method of claim 10, wherein measuring a LO leakage signal in the modulated carrier signal to obtain a LO leakage signal value further comprises low pass filtering the generated sums and differences of signal frequencies.

12. The method of claim 10, wherein measuring a LO leakage signal in the modulated carrier signal to obtain a LO leakage signal value further comprises generating a digital value proportional to the magnitude of at least one of a spectral component at the test frequency to generate the leakage signal value.

13. The method of claim 9, further comprising:
    determining if the magnitude of the leakage signal value is below a leakage threshold; and
    if the magnitude of the leakage signal value is not below the leakage threshold, continuing to adaptively adjust at least one of an in-phase DC offset or a quadrature DC offset in response to the leakage signal value until the leakage signal value is below the leakage threshold.

14. A communication device, comprising:
    means for generating a in-phase baseband signal and a quadrature baseband signal at a test frequency;

means for modulating a carrier signal by the in-phase and quadrature baseband signals;

means for measuring at least one of a LO leakage signal or a side band signal in the modulated carrier signal, the measuring step comprising:
  generating sums and differences of frequency components in the modulated carrier signal;
  low pass filtering the generated sums and differences; and
  utilizing the filtered sums and differences to generate a digital value proportional to the magnitude of a spectral component at the test frequency, the digital value comprising a LO leakage signal value or a side band signal value, respectively;

means for adjusting at least one of the LO leakage signal or side band signal in response to the LO leakage signal value or the side band signal value, respectively;

means for determining if the magnitude of at least one of the LO leakage signal value is below a leakage threshold or the side band signal value is below a side band threshold;

if the magnitude of the LO leakage signal value is not below the LO leakage Threshold, means for continuing to adaptively adjust at least one of an in-phase DC offset or a quadrature DC offset in response to the leakage signal value until the leakage signal value is below the leakage threshold; and if the magnitude of the side band signal value is not below the side band threshold, means for continuing to adaptively adjust at least one of an in-phase gain, a quadrature gain, or a channel correlation in response to the side band signal value until the side band signal value is below the side band threshold.

15. A communication system, comprising:
a modulator configured to generate a modulated carrier signal modulated by an in-phase baseband signal and a quadrature baseband signal at a baseband signal frequency;
a signal processor configured to detect at least one of a LO leakage signal or a side band signal in the modulated carrier signal, the signal processor comprising:
  a sum-and-difference signal generator configured to generate a plurality of signals based on the sum and differences of a carrier frequency and baseband signal frequency;
  a filter configured to pass at least one of the plurality signals having a frequency proportional to the baseband frequency signal;
  an analog-to-digital converter configured to generate a digital output value proportional to the magnitude of the at least one of the plurality signals; and
  a processor configured to receive the digital output value and generate a DC offset control signal in response to a spectral component at the baseband signal frequency or a gain control signal in response to a spectral component at a multiple of the baseband signal frequency; and
a baseband signal controller configured to receive the at least one of the gain control signal or the DC offset control signal and generate at least one of a gain signal or an offset signal to adjust at least one of the LO leakage signal or side band signal, respectively,
wherein the signal processor and baseband signal controller are operatively associated to adaptively lower the LO leakage signal by adjusting at least one of an in-phase DC offset or a quadrature DC offset in response to the LO leakage signal value until the LO leakage value is below a LO leakage value threshold or to adaptively lower the side band signal by adjusting at least one of an in-phase gain, a quadrature gain, or a channel correlation in response to the side band signal value until the side band signal value is below a side band signal value threshold.

16. The communication system of claim 15, wherein the baseband signal controller comprises at least one of a gain controller and offset controller, the gain controller configured to receive the gain control signal and generate the in-phase baseband signal gain, the quadrature baseband signal gain, or the correlation setting, and the offset controller is configured to receive the DC offset control signal and generate the in-phase DC offset or the quadrature DC offset.

17. The communication system of claim 16, wherein the processor and the baseband signal controller comprise field programmable gate arrays.

18. The communication system of claim 16, wherein the modulator comprises a quadrature amplitude modulator.

* * * * *

UNITED STATES PATENT AND TRADEMARK OFFICE
CERTIFICATE OF CORRECTION

PATENT NO. : 7,443,924 B2
APPLICATION NO. : 10/955223
DATED : October 28, 2008
INVENTOR(S) : Mark Dale et al.

It is certified that error appears in the above-identified patent and that said Letters Patent is hereby corrected as shown below:

At Column 8, line 41, delete -- or --

At Column 9, line 23, replace -- Threshold -- with -- threshold --

Signed and Sealed this

Sixteenth Day of December, 2008

JON W. DUDAS
*Director of the United States Patent and Trademark Office*